FAVORITE STATION SIGNAL SEEKING TUNER

Filed Sept. 20, 1954 2 Sheets-Sheet 1

INVENTORS
Edward F. Andrews &
BY Olgierd Gierwiatowski
L. D. Burch
ATTORNEY

FAVORITE STATION SIGNAL SEEKING TUNER

Filed Sept. 20, 1954 2 Sheets-Sheet 2

INVENTORS
Edward F. Andrews &
Olgierd Gierwiatowski
BY L. D. Burch
ATTORNEY

United States Patent Office 2,854,569

Patented Sept. 30, 1958

2,854,569

FAVORITE STATION SIGNAL SEEKING TUNER

Edward F. Andrews, Belleair Beach, and Olgierd Gierwiatowski, Indian Rocks Beach, Fla., assignors to General Motors Corporation, Detroit, Mich., a corporation of Delaware Application September 20, 1954, Serial No. 457,009

9 Claims. (Cl. 250—20)

Figure 1:
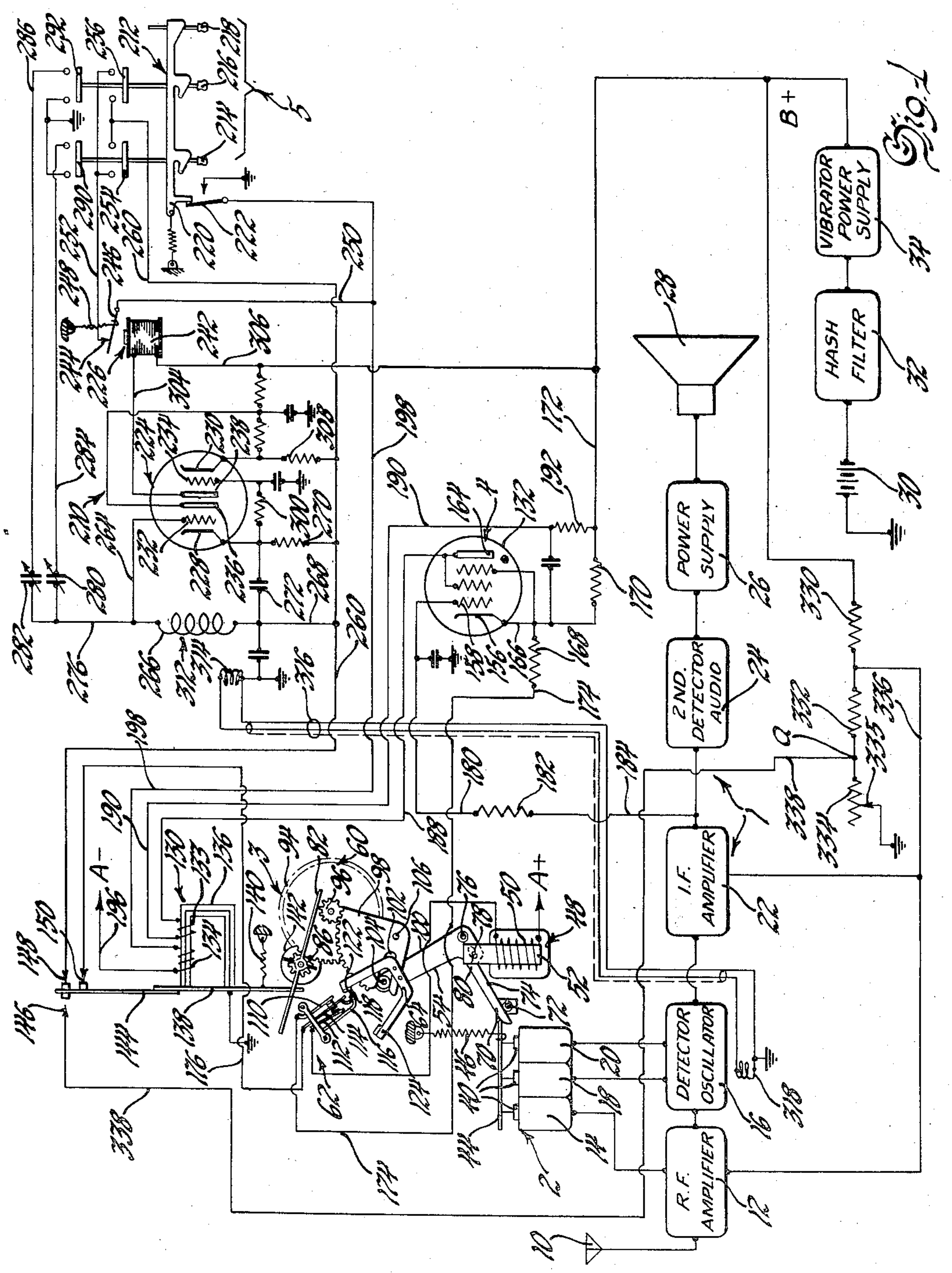

This invention relates to preselective or "favorite station" signal seeking tuners of a type specially suited for use in automobile radio receivers and mobile radio installations.

Such tuners afford in automatic signal tuned or stop-on-signal tuned receivers a selective control feature whereby the operator may cause the tuner automatically to scan and stop on a particular carrier frequency without seeking through the entire spectrum in a station by station search for a desired station, as is done in the case of straight or random signal seeking devices.

Preselective or combination straight and favorite station signal seeking tuners with which the present invention is concerned have been of two main types. The preselective or favorite station control portion of one of these types is somewhat mechanical in form and employs an arrangement of conductive switch-like positionable tab or other elements, which are individually pre-set to correspond to the relative position in the frequency spectrum or band of receiver operation of particular favored stations in the locale where the receiver is to be operated and are adapted to be selectively inserted in an electrical control circuit, as by an arrangement of associated push buttons. This form of tuner further employs means whereby the signal transmission through the receiver is effectively blocked—either by shorting or opening one or more receiver stages upon commencement of the automatic scanning operation—except over a small predetermined portion of the tuning range corresponding to the position in space of a selected one of the aforesaid tabs or push buttons. The sensitivity of the receiver is restored over this small portion of the receiver tuning range, and the straight signal seeking tuner portion thereof permitted to operate and stop the tuning upon the reception of the desired signal lying within the region in which the seeking operation is not effectively disabled. This form of tuner suffers from the disadvantage that the tuning tabs are apt to be displaced and readily go out of alignment in the course of the tuning operation and, moreover, apt to break, bend, jam and become dirty, any of which factors impair the tuning operation.

The other of the aforementioned combination type signal seeking tuners is of a more electronic character and employs an auxiliary oscillator circuit the tuning of which may be adjusted by capacitance circuit elements, which are adapted for selective insertion in the oscillator circuit by an arrangement of associated push buttons and adjust the oscillator tuning a few kilocycles or less than one channel in advance of an oscillator frequency corresponding to that of a particular station desired to be received. The oscillator is coupled to react upon or to impress its output upon the input of the receiver, the sensitivity of which is reduced during the automatic scanning operation until the receiver tuning corresponds to the oscillator signal when the latter is put out of operation, the receiver sensitivity restored and the tuning operation prematurely interrupted and then restarter to permit straight signal seeking operation of the receiver to stop the tuning at the desired station. The fact that the tuning operation is interrupted twice in the tuning of the receiver to a desired signal is very distracting, particularly in automobile radio receivers, not to mention the stringent acceleration and deceleration requirements placed upon the driving means by reason of the premature stopping thereof, and does not make for entirely satisfactory operation of receivers of this character.

Accordingly, the present invention has for its general object to effect improvements in apparatus of this general character and to provide such apparatus as is not open to the above and other objections to prior forms of tuners of this and a related character. More particularly, the present invention seeks to provide a preselective or combination straight and favorite station signal tuner apparatus which does not employ positionable tuning tabs or presettable mechanical tuning elements and in which the tuning operation is not characterized by premature or multiple interruptions in the course of tuning the receiver to a particular station.

Figure 2:
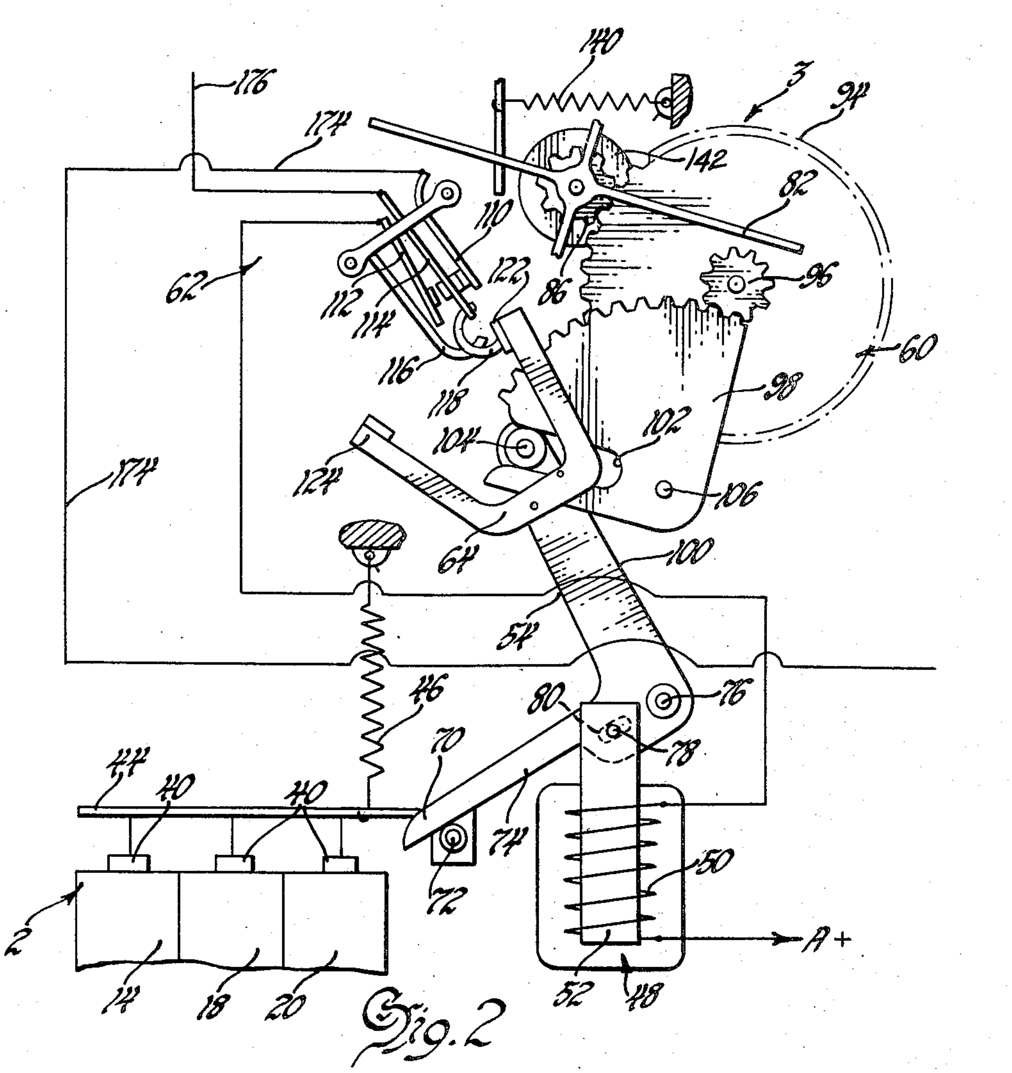

The foregoing and other objects of the present invention together with the features, advantages and mode of operation thereof will appear more fully from the following detailed description and drawings in which:

Fig. 1 is a schematic electric circuit diagram illustrating a preferred form of automatic tuning apparatus in accordance with the present invention; and Fig. 2 is an enlarged view of a form of power driving apparatus which is associated with the tuning instrumentality and may be employed in the tuning control apparatus of the present invention.

Referring to the drawings, the apparatus shown therein comprises, in general, a conventional superheterodyne type receiver 1 having a variable tuning instrumentality 2 for tuning thereof, power driving means 3 for varying said tuning instrumentality progressively over the tuning range of the receiver, stop-on-signal control means 4 operated by said receiver for stopping the variation of the tuning thereof in response to the reception of an incoming signal of a predetermined intensity, and preselective or favorite station control means 5 affording selective control over the received tuning whereby the receiver may be caused to automatically tune to a particular carrier frequency.

The receiver 1 is of completely conventional design and includes an antenna 10; a tuned radio frequency amplifier 12 and its associated variable tuning means 14; a first detector and oscillator 16 and the variable tuning means 18 and 20 associated therewith; an intermediate frequency amplifier 22, which may have a plurality of stages; a second detector and audio section 24; a power output section 26 and a loudspeaker 28 driven from the power output section.

Power is supplied to the apparatus from the vehicle storage battery 30 having one of the terminals thereof grounded. The battery also serves to supply filament power for the tubes of the various stages as well as to energize a relay and a solenoid, which form a part of the stop-on-signal section of the tuner, as will be later described. A hash filter 32 and high voltage vibrator "B" supply unit 34 supplying operating voltage for the plate and other electrodes of the various electron tubes employed in the receiver are connected between the ungrounded terminal of the battery 30 and the "B+" terminals of the apparatus shown in the drawing.

The variable tuning means 14, 18 and 20 constituting the variable tuning instrumentality of the receiver are illustrated in the drawing as being of the variable permeability type having powdered iron cores 40 movable axially within the interior of associated coils which are contained within the shielded housing of the tuning units, in known manner. The cores are mounted for simultaneous movement upon a yoke or tuning bar 44 the movement of which is effected and controlled by the power driving means 3 which may be of the type more fully shown and described in U. S. Patent 2,493,741 assigned to the present assignee.

The power tuning means 3 briefly comprises a power storage means shown as a spring motor 46 having one end attached to the yoke 44 and the other end, say, to the receiver chassis; a recharging means in the form of a solenoid 48 having an energizable winding 50 and plunger 52; a pivotally mounted bell crank lever 54, which is associated with the yoke 44 and a transmission indicated generally at 60; a position limit switch 62 and an actuating mechanism 64 therefor. The solenoid plunger 52 is operatively connected to the yoke 44 through the pivotally mounted bell crank lever 54, which has an arm 70 in camming relation with a roller 72 mounted for movement with the yoke, the roller being engaged by a roller engaging surface 74 of the arm 70. The lever 54 is pivotally mounted for movement about a pivot 76 about which it is moved in a counterclockwise direction by the solenoid plunger when the solenoid is energized. The plunger 52 is connected to the lever through a pin and slot connection including the pin 78 extending through the upper end of the plunger and a slot 80 in the lever 54.

The transmission 60 includes a tuning movement restraining means in the form of a wind vane of air governor 82 which is rotatably driven by a high speed gear 86 preferably through a one way drive connection shown in the aforementioned patent. The high speed gear is driven by the spur gear 94 which in turn is driven by a pinion 96. The transmission further includes a sector gear 98 and a slot and roller connection including slot 102 on the sector gear and roller 104 mounted at the end of the arm 100 of the bell crank lever 54 whereby the sector gear is coupled to the bell crank lever. The sector gear drives pinion 96 and moves about an axis defined by its supporting pin 106.

The energization of the winding 50 of the spring charging solenoid 48 is selectively controlled by the position limit switch 62 and limit switch actuating member 64. The limit switch is of the S. P. D. T. snap-action variety having a pair of stationary contacts 110 and 112 and a movable switch blade 114 and further includes a switch yoke 116 which is operatively connected to the center and movable switch blade contact 114 of the limit switch by a generally U-shaped over center resilient member 118 interposed between the movable blade and the yoke 116. The switch actuating member 64, which is of generally U-shaped construction and is made of non-conductive material, is mounted near the end of the arm 100 of bell crank lever 54 and includes a contacting lug or abutment 122 at one end adapted to engage spring 118 and a second lug or abutment 124 spaced from the first, substantially as shown.

When the lug 124 engages the limit switch yoke 116 in the clockwise movement of the crank carried member 64 during the tuning operation, the switch yoke is moved so that the yoke end of the spring 118 is moved over center, whereupon the movable contact blade 114 of the limit switch is moved out of engagement with stationary contact 110 and engages contact 112. The disengagement of blade 114 with contact 110 breaks a ground circuit for the control tube of the stop-on-signal control circuit, presently to be described, so as to render the stop-on-signal means inoperative during the recharging period of the power spring 46, while the engagement of the switch blade 114 with contact 112 completes an energizing circuit for the winding 50 of the spring recharging solenoid 48 connecting it across the battery when the relay of the stop-on-signal control circuit is in its closed or operating position.

When the charging solenoid is energized, the plunger 52 thereof is rapidly pulled downwardly thereby to recharge or re-tension the spring 46 and moves or racks the cores 40 back to their low frequency or innermost position. When the drive spring has been recharged and the tuning cores have been moved to their low frequency limit, the limit switch 62 is operated by the lug 122 on the actuating member which has been moved counterclockwise by the plunger to the position shown in the drawing to de-energize the solenoid and to recondition or enable the stop-on-signal control means for operation.

The stop-on-signal control means 4 includes a relay 130 and electron tube 132 and associated circuit therefor to be described. The relay 130 is of the flux-latched type described in the aforementioned patent and includes a pair of windings 133 and 134 oppositely wound on a generally U-shaped core 136 having a magnetic path closing element in the form of an armature 138 adapted to be actuated to bridge the gap between the open ends or legs of the core. The armature is pivotable about a point intermediate its ends and is normally maintained out of bridging or magnetic path closing relationship with the core 136 by a spring 140 between the pivot and the lower end of the armature which provides a brake shoe for a brake disc 142 affixed to the high speed gear 86 of the transmission 60. The upper end of the armature constitutes a movable switch element 144 which is adapted to close electrical contacts 146 or 148 and 150 depending upon whether the relay armature is in its operating closed or flux-latched position shown when the receiver is in signal seeking condition or in its operated to open or brake application position in which automatic tuning variation of the receiver is prevented.

The stop-on-signal relay tube 132 may be of the gas filled variety if desired and includes a cathode 156, control grid 158, and plate 164 electrode. The cathode is connected over conductor 166 to the junction of a potential divider formed by resistors 168 and 170, the latter being connected over conductor 172 to the high voltage B+ supply line. The left side of resistor 168 is connected to a ground circuit established by conductor 174, contact 110 and blade 114 of limit switch 62, conductor 176 connected to contact 150 of the armature extension 144 and armature 138 to ground. The control grid 158 is connected in a signal energizing circuit which includes conductor 180, resistor 182 and conductor 184 which is connected to the output of the set I. F. amplifier. Plate 164 is connected in a circuit which includes conductor 188, relay coil 133, conductor 190, voltage dropping resistor 192 connected to conductor 172 and B+.

Winding 134 of relay 130 is connected in a circuit, which includes conductor 196 connected to the ungrounded terminal of the battery 30, and to conductor 198 which is connected to ground through either of a pair of switch controlled paths in the preselective control portion 5 of the tuner, as will be described. Winding 134 is an operating winding and, when energized, produces a flux which moves the relay armature 138 to its bridging position or brake releasing position shown, permitting automatic tuning operation and enabling or conditioning the stop-on-signal control circuit 4 for operation. Winding 133 is a bucking winding and is energized by the current flow of the normally non-conducting stop-on-signal control tube 132 when the latter becomes conductive upon reception of a signal of predetermined intensity. When winding 133 is energized it produces a flux that opposes or bucks the magnetic flux-latched relay to its operated or magnetic open circuit position when the brake is applied to prevent automatic tuning operation and the stop-on-signal control circuit rendered inoperative.

The preselective or favorite station control portion 5 of the present invention includes a frequency selective control circuit 210 in conjunction with a push button selector switch 212 having a plurality of interlocked push buttons 214, 216 and 218 which may be operated in any desired sequence. The selector switch is of the type in which depression of any of the push buttons releases any previously depressed push buttons and includes a movable rack bar 220 and a switch 222 that is momentarily closed to complete an energizing circuit for the operating or closing winding 134 of the stop-on-signal relay 130 when any one of the push buttons is depressed. The push buttons 214 and 216 are favorite station selector buttons and, while only two of such buttons are shown, it will be understood that several additional like buttons ordinarily would be employed in a typical automobile receiver installation. Push button 218 enables straight stop-on-signal or non-preselective automatic tuning operation.

The frequency selective control circuit 210 includes a double vacuum control tube 224 and a locking control relay 226, the vacuum tube having a pair of cathodes 228 and 230, control grid 232 and 234 and plate 236 and 238 electrodes, all of which may be enclosed within a single envelope such as in the 6SN7 variety. The control relay 226 of the preselective automatic tuning control portion of the present invention includes an energizable winding 242 for operating an associated relay switch constituted by stationary contact 244 and movable armature 246. The armature is held in the normally de-energized condition of the winding 242 in the position shown against contact 244 by the spring 248 and completes a hold-in circuit shunting switch 222 for the operating winding 134 of relay 130, the hold-in circuit including conductor 250, which is connected to conductor 198 from winding 134, the contacts of relay switch 226, conductor 252, conducting bridging segment 254 or 256 associated with selector buttons 214 and 216 depending upon which of the latter is depressed, conductor 260 connected to contact 148 of armature 138 of relay 130 and through the armature to ground when the stop-on-signal flux-latched relay 130 is in its closed or operating position shown.

The grid-cathode circuit of the first section of the preselective control circuit control tube 224 is connected in a circuit which includes conductor 264 and inductance coil 266, conductor 268 and self biasing resistor 270 and condenser 272 connected back to the cathode, the cathode circuit being connected to ground over conductor 260 through the contact 148 and armature 138 of relay 130. The grid side of coil 266 is connected by conductor 276 to one side of each of a plurality of variable trimmer condensers 280, 282 which are associated with respective ones of the favorite station selector buttons 214 and 216 and are adapted to be selectively connected to ground over conductors 284, 286 by auxiliary conducting bridging segments 290, 292 associated with said selector buttons.

Cathode 228 of the first section of 224 is coupled over resistor 300 to the control grid 234 of the second section of the frequency selective circuit control tube 224, and plate 238 is connected over conductor 304 to one side of the winding 242 of the control relay 226 the other side of which is connected over conductor 306 to the B+ supply line. Cathode 230 is connected over biasing resistor 308 to conductor 260 which is connected to ground through the contact 148 and armature 138 of relay 130 when the latter is in its operation position.

Coil 266, in conjunction with either of the trimmer condensers 280, 282 of the preselective control circuit, constitutes a tuned secondary of an air core coupling transformer 312, the primary 314 of which is connected over a shielded conductor pair 316 to a coil 318 which is inductively coupled as to the set local oscillator in the detector oscillator section 16 of the receiver and transmits the varying oscillator frequency as the oscillator tuning is being varied by the power driving means to the tuned input circuit of the oscillator-responsive control tube 224. The trimmer condensers 280 and 282 are individually adjusted to tune the input circuit of the oscillator-responsive control tube 224 to within a few kilocycles and less than one channel separation in advance of the oscillator frequency corresponding to the carrier frequency of the transmitting station desired to be selected and in relation to the direction in which the tuning automatically progresses through the range of receiver operation.

It will be noted that the input circuit of the frequency-responsive control circuit 210 is coupled to the oscillator output in signal receiving relation therefrom and has no forward reaction on the set in the sense that no signal originates in or is generated by the frequency selective control circuit for transmission through the receiver.

The operation of the preselective automatic tuning control system in the receiver is as follows. Depression of a favorite station button, as 214 for example, inserts trimmer condenser 280 in the input circuit of the oscillator responsive control tube 224 and causes momentary closure of switch 222 to energize operating winding 134 of the stop-on-signal relay 130. Armature 138 is attracted to the relay operating position and establishes a ground return circuit through contacts 148 and 150 for the circuits of the stop-on-signal responsive control tube 132 and oscillator signal responsive control tube 224 conditioning the control circuits containing these tubes for operation. The lower end of the armature 138 releases the brake disc 142 to permit automatic variation of the adjustably tuned circuits of the receiver by the spring motor through the associated transmission. Upon release of the push button 214, which remains in a depressed position, rack 220 is returned to its normal position and opens switch 222. Energization of the operating coil 134 of the relay 130, however, is maintained by the hold-in circuit established by the armature 246 and stationary contact 244 of the locking relay 226 which are connected in series with the bridging switch element 256 associated with the push button 214 and with the contact 148 and grounded armature 138 of the relay 130.

When the frequency of the locally generated signal developed by the set oscillator 16 corresponds to the frequency to which the input circuit of the oscillator responsive control tube 224 is tuned, the oscillator signal overcomes the bias on the first triode section, operating as an infinite impedance detector, and a rectified signal is applied to the grid 234 of the second triode section, which amplifies the rectified control signal and energizes the locking relay 226. The tube 224 now passes sufficient current to cause the armature 246 to be withdrawn from the contact 244 of the locking relay, thus breaking the hold-in circuit and de-energizing the operating winding 134 of the stop-on-signal relay 130. However, the armature 138 of the stop-on-signal circuit relay is retained in the attracted position by the residual flux circulating in the core 136 thereof and remains flux-latched in this position until the tuner has further progressed to a frequency corresponding substantially to that of the desired station allocated to the depressed push button. The signal responsive control tube 132 then conducts and/or passes sufficient energizing current through the winding 133 to buck the residual flux and cause the armature 138 to be withdrawn or retracted by the spring 140 to the operated position of the relay 130 opposite the position shown. This brakes the disc 142 to stop the tuning variation of the receiver.

It will thus be seen that the preselective tuning control 5 of the present invention overrides or prevents the stop-on-signal control circuit 4 from being effective to cause stopping of the tuning variation substantially over the entire tuning range of the receiver except in the vicinity of the carrier frequency of a station allocated to a push button. For all other intervening received signals, the armature 138 of the stop-on-signal relay 130 is prevented from returning to its operated or unlatched open position by reason of the continued energization of the operating coil 134 thereof the magneto motive effect of which is sufficient to retain the armature 138 in its operating position even where the opposing coil 133 is energized upon the reception of an intervening station signal other than that selected by the push button.

The push button 218, as mentioned before, provides straight signal seeking operation and when depressed causes disengagement of any previously depressed push button and momentary closure of switch 222 for momentary energization of winding 134 and flux-latching of the armature 138 which will be unlatched upon the reception of the first signal of sufficient intensity to cause energization of the winding 133.

In order that the receiver will stop on only such carrier signals as are above a predetermined signal intensity when the receiver is being self-tuned solely under the control of the stop-on-signal control means 4, i. e. straight signal seeking operation, the sensitivity of the receiver may be reduced as by the application of a positive biasing voltage to the cathodes of the set R. F. amplifier 12 and I. F. amplifier 22 during the automatic tuning variation of the receiver. This may be accomplished by the provision of a resistor chain 330, 332 and 334 connected between B+ and ground. Resistor 334 is adjustable and is provided with an adjustable arm 335 to set the initial sensitivity of the receiver. Conductor 336 is connected between resistors 330 and 332 and to the cathodes of the R. F. amplifier and I. F. amplifier tubes. Conductor 338 is connected to junction point *a* between resistors 332 and 334 and to back contact 146 associated with the grounded relay armature 138. When the receiver is in self-tuning or signal seeking condition and the relay armature latched, the ground connection at the low potential end of resistor 332 is shifted to the position of the adjustable arm 335 of resistor 334, which is effectively inserted in the resistor chain by breaking the ground circuit at contact 146, whereby the potential at point *a* increases relative to ground and a higher positive biasing voltage is applied to the cathodes of 12 and 16 thereby decreasing the sensitivity of the receiver during this form of operation.

While the invention has been shown and described in a superheterodyne radio receiver for broadcast operation, its use is not necessarily restricted to this field and it may find application in other related and allied control fields.

What is claimed is:

1. In a favorite station signal seeking receiver having a tunable input section including a beating oscillator and variable tuning means for varying the receiver tuning, driving means for varying said tuning means progressively over the operating frequency range of said receiver, means for initiating tuning variation of said receiver by said driving means, and signal responsive control means connected to said receiver and operative to exercise automatic stopping control over said receiver tuning variation upon the reception of an incoming signal of a predetermined intensity, said signal responsive control means including a relay having a winding energizable to initiate said tuning variation of said receiver and another winding energizable to stop tuning variation thereof; frequency responsive control means preventing operation of said signal responsive control means until said receiver is tuned to a predetermined frequency that is separated less than one channel from the frequency of a preselected station to which it is desired to tune the receiver, said frequency responsive control means including a frequency selective circuit tuned to a preselected frequency slightly lower than that to which said beating oscillator is tuned when said receiver is tuned to said preselected station frequency, means coupling said circuit to said beating oscillator of said receiver tunable input section in signal receiving relation therefrom, control means connected in said frequency selective circuit and in circuit controlling relation with one of said relay windings and a second control circuit connected to the tunable input section and to the other relay winding upon which a signal is developed when a station is accurately tuned to stop the tuning means on station.

2. In a favorite station signal seeking receiver having a tunable input section including a beating oscillator and variable tuning means for varying the tuning of said receiver section, driving means for varying said tuning means progressively over the operating frequency range of said receiver, means for initiating tuning variation of said receiver by said driving means, and signal responsive control means connected to said receiver and operative to exercise automatic stopping control over said receiver tuning variation upon the reception of an incoming signal of a predetermined intensity, said signal responsive control circuit including a flux-latched relay having a flux-latching winding energizable to initiate tuning variation of said receiver and a stopping winding energizable from said receiver to stop said tuning variation, frequency responsive control means including a tunable circuit tuned to a frequency slightly less than that of the beating oscillator when the receiver is tuned to a preselected station, said frequency responsive control means being connected in circuit completing relation with said flux-latching winding of said relay and operable to open the circuit thereof when said beating oscillator is tuned to a frequency corresponding to that to which said frequency responsive control means is tuned and a second control circuit connected to the receiver and to the stopping winding upon which a signal is developed upon tuning in a station to stop the tuning means if the frequency responsive control means has been energized.

3. The combination in accordance with claim 2 above including a push button selector having a plurality of push buttons presettable for the selection of received signals of particular frequencies and wherein said frequency responsive control means includes a frequency selective circuit having a plurality of frequency responsive tuning elements each adapted to be selectively inserted in said frequency selective circuit by respective ones of said push buttons for tuning said frequency responsive control means to preselected frequencies each of which is slightly lower than that to which said beating oscillator is tuned when said receiver is tuned to a corresponding one of said received signals.

4. In a favorite station signal seeking receiver having a tunable input section including a beating oscillator and variable tuning means for varying the tuning of said receiver section, driving means for varying said tuning means progressively over the operating frequency range of said receiver, means for initiating tuning variation of said receiver by said driving means, and signal responsive control means connected to said receiver and operative to exercise automatic stopping control over said receiver tuning variation upon the reception of an incoming signal of a predetermined intensity, said signal responsive control circuit including a flux-latched relay having a flux-latching winding energizable to initiate tuning variation of said receiver and a stopping winding energizable to stop said tuning variation, and frequency responsive control means including a tunable circuit tuned to a frequency slightly less than that of the beating oscillator when the receiver is tuned to a preselected station, said frequency responsive control means being connected in circuit completing relation with said flux-latching winding of said relay and operable to open the circuit thereof when said beating oscillator is tuned to a frequency corresponding to that to which said frequency responsive control means is tuned, said control means including an infinite impedance detector connected in said frequency responsive control circuit and in circuit controlling relation with said flux-latching winding of said relay and a second control circuit connected betwen the tunable input section and the stopping winding in which a signal is developed upon the tuning in of a station to stop the tuning means.

5. The combination in accordance with claim 4 above including a push button selector having a plurality of push buttons presettable for the selection of received signals of particular frequencies and wherein said frequency selective circuit of said frequency responsive control means includes a plurality of frequency responsive tuning elements each adapted to be selectively inserted in said circuit by respective ones of said push buttons.

6. In a radio receiver having a radio frequency amplifying section, a local oscillator, an intermediate frequency amplifying section and tunable means for tuning the receiver over a frequency spectrum, driving means connected to said tunable means to drive it over its range, relay means operatively associated with said driving means to control the same and index it to stop at desired points for the reception of certain stations, a pair of separate control circuits connecting said local oscillator and said intermediate frequency amplifying section with the relay means and through which signals are developed upon the tuning in of a station to in combination actuate said relay means to stop on station only when both said control circuits are energized.

7. In a radio receiver having a radio frequency amplifying section, a local oscillator, an intermediate frequency amplifying section and tunable means for tuning the receiver over a frequency spectrum, driving means connected to said tunable means to drive it over its range, relay means operatively associated with said driving means to control the same and index it to stop at desired points for the reception of certain stations, a first control circuit interconnecting the local oscillator and relay means including a plurality of adjustable tuned circuits and selective switching means in parallel so that the various tuned circuits may be selectively included and when one of the tuned circuits corresponds with the frequency of the local oscillator a signal is applied to the relay means to condition the same for operation but does not cause it to operate and a second control circuit interconnecting the intermediate frequency amplifier output and the relay means and upon which a signal is developed upon the tuning in of a station to apply an actuating signal thereto to stop the tunable means if the first control circuit is energized.

8. In a radio receiver having a radio frequency amplifying section, a local oscillator, an intermediate frequency amplifying section and tunable means for tuning the receiver over a frequency spectrum, driving means connected to said tunable means to drive it over its range, relay means operatively associated with said driving means to control the same and index it to stop at desired points for the reception of certain stations, said relay means having a plurality of operating coils thereon to control the same, a first control circuit connected to the local oscillator and to one of the operating coils and including a plurality of parallel circuits with adjustable tuned circuits and selective switches in each to determine which tuned circuit is active for developing a signal when the frequency of the local oscillator and the tuned circuit substantially coincide to control the energization of the one operating coil and a second control circuit connected to the amplifying section and to a second operating coil of the relay on which a signal is developed upon the tuning in of a station to cause the relay to be actuated if the first control circuit is energized.

9. In a radio receiver having a radio frequency amplifying section, a local oscillator, an intermediate frequency amplifying section and tunable means for tuning the receiver over a frequency spectrum, driving means connected to said tunable means to drive it over its range, relay means operatively associated with said driving means to control the same and index it to stop at desired points for the reception of certain stations, a plurality of tuned circuits adjustable to different frequencies and commonly connected to said local oscillator, switching means connected to the plurality of tuned circuits to selectively include one in the circuit, further switching means connected to said plurality of tuned circuits and to the relay means to condition the latter for operation when the frequency of the local oscillator is substantially that of the tuned circuit included and electronic control means connected to said intermediate frequency amplifier and to the relay means in which a signal is generated upon the tuning in of a station to apply an actuating signal thereto to stop the tunable means if the further switching means has conditioned the relay means so that it may operate.

References Cited in the file of this patent

UNITED STATES PATENTS

| | | |
|---|---|---|
| 2,490,591 | Himmer | Dec. 6, 1949 |
| 2,493,741 | Andrews | Jan. 10, 1950 |
| 2,499,875 | Pifer | Mar. 7, 1950 |
| 2,499,967 | Nicholson | Mar. 7, 1950 |
| 2,501,003 | Pifer | Mar. 21, 1950 |